United States Patent
Lai et al.

(10) Patent No.: US 11,145,867 B2
(45) Date of Patent: Oct. 12, 2021

(54) SURFACE TREATED COPPER FOIL

(71) Applicant: CHANG CHUN PETROCHEMICAL CO., LTD., Taipei (TW)

(72) Inventors: Chien-Ming Lai, Taipei (TW); Yao-Sheng Lai, Taipei (TW); Jui-Chang Chou, Taipei (TW)

(73) Assignee: CHANG CHUN PETROCHEMICAL CO., LTD., Taipei (TW)

( * ) Notice: Subject to any disclaimer, the term of this patent is extended or adjusted under 35 U.S.C. 154(b) by 0 days.

(21) Appl. No.: 16/654,723

(22) Filed: Oct. 16, 2019

(65) Prior Publication Data

US 2020/0248330 A1    Aug. 6, 2020

Related U.S. Application Data

(60) Provisional application No. 62/800,263, filed on Feb. 1, 2019.

(51) Int. Cl.
*B32B 15/01* (2006.01)
*H01M 4/66* (2006.01)
(Continued)

(52) U.S. Cl.
CPC .............. *H01M 4/661* (2013.01); *B32B 15/01* (2013.01); *B32B 15/08* (2013.01); *B32B 15/20* (2013.01); *C25D 1/04* (2013.01); *C25D 3/04* (2013.01); *C25D 3/12* (2013.01); *C25D 3/22* (2013.01); *C25D 3/38* (2013.01); *C25D 5/10* (2013.01); *C25D 5/14* (2013.01); *C25D 5/16* (2013.01); *C25D 5/48* (2013.01); *H01M 4/0469* (2013.01);
(Continued)

(58) Field of Classification Search
CPC ....................................................... C25D 5/16
USPC ............................................................ 361/748
See application file for complete search history.

(56) References Cited

U.S. PATENT DOCUMENTS 9,899,683 B2   2/2018   Lee et al.
10,205,170 B1  2/2019   Huang et al.
(Continued)

FOREIGN PATENT DOCUMENTS

CN   1543292 A   11/2004
CN   2752274 Y    1/2006
(Continued)

OTHER PUBLICATIONS

Belov et al. (Correlation between 3D Texture of Steel Substrate and Tin-Coated Surface with Various Coating Masses, ISSN: 1662-9795, vol. 769, pp. 120-127, doi:10.4028/www.scientific.net/KEM.769.120, © 2018 Trans Tech Publications Ltd, Switzerland), (Year : 2018).*

(Continued)

*Primary Examiner* — Stanley Tso
(74) *Attorney, Agent, or Firm* — Nixon Peabody LLP; Thomas P. Pavelko (57) ABSTRACT

Surface-treated copper foils exhibiting a void volume (Vv) in a range of 0.4 to 2.2 $\mu m^3/\mu m^2$ and an arithmetic mean waviness (Wa) lower than or equal to 0.4 μm are reported. Where the surface-treated copper foil is treated on the drum side and includes a treatment layer comprising a nodule layer. Such surface-treated copper foils can be used as a conductive material having low transmission loss, for example in circuit boards.

14 Claims, 3 Drawing Sheets

(51) Int. Cl.

| | | |
|---|---|---|
| *H01M 4/04* | (2006.01) | |
| *H01M 10/0525* | (2010.01) | |
| *C25D 1/04* | (2006.01) | |
| *H01M 4/70* | (2006.01) | |
| *B32B 15/08* | (2006.01) | |
| *B32B 15/20* | (2006.01) | |
| *C25D 3/04* | (2006.01) | |
| *C25D 3/12* | (2006.01) | |
| *C25D 3/22* | (2006.01) | |
| *C25D 3/38* | (2006.01) | |
| *C25D 5/14* | (2006.01) | |
| *C25D 5/16* | (2006.01) | |
| *C25D 5/48* | (2006.01) | |
| *H05K 1/09* | (2006.01) | |
| *H05K 1/18* | (2006.01) | |
| *H05K 3/38* | (2006.01) | |
| *C25D 5/10* | (2006.01) | |
| *H05K 1/02* | (2006.01) | |
| *H01M 4/02* | (2006.01) | |

(52) U.S. Cl.
CPC ......... *H01M 4/70* (2013.01); *H01M 10/0525* (2013.01); *H05K 1/0242* (2013.01); *H05K 1/09* (2013.01); *H05K 1/18* (2013.01); *H05K 1/181* (2013.01); *H05K 3/384* (2013.01); *H05K 3/389* (2013.01); *B32B 2255/06* (2013.01); *B32B 2255/205* (2013.01); *B32B 2255/28* (2013.01); *B32B 2307/202* (2013.01); *B32B 2457/08* (2013.01); *H01M 2004/027* (2013.01); *H05K 2201/0338* (2013.01); *H05K 2201/0355* (2013.01); *H05K 2201/0373* (2013.01); *H05K 2201/10522* (2013.01); *H05K 2201/2054* (2013.01); *H05K 2203/0307* (2013.01); *Y10T 428/12431* (2015.01)

(56) References Cited

U.S. PATENT DOCUMENTS

| | | | |
|---|---|---|---|
| 10,424,793 B2 * | 9/2019 | Cheng | H01M 4/70 |
| 10,622,637 B1 * | 4/2020 | Huang | H01M 4/661 |
| 2004/0029006 A1 | 2/2004 | Otsuka et al. | |
| 2006/0210823 A1 | 9/2006 | Sano et al. | |
| 2008/0280159 A1 | 11/2008 | Iwakiri et al. | |
| 2011/0127074 A1 | 6/2011 | Takahashi | |
| 2011/0223455 A1 | 9/2011 | Kimura et al. | |
| 2012/0111733 A1 | 5/2012 | Tsai et al. | |
| 2013/0011690 A1 | 1/2013 | Arai et al. | |
| 2013/0040162 A1 | 2/2013 | Fujisawa et al. | |
| 2014/0264417 A1 * | 9/2014 | Kobayashi | H01L 33/60 257/98 |
| 2016/0264417 A1 | 9/2016 | Bouillon et al. | |
| 2017/0042036 A1 | 2/2017 | Miyamoto | |
| 2017/0320247 A1 * | 11/2017 | Aizawa | B29C 45/14 |
| 2018/0083309 A1 | 3/2018 | Ho et al. | |
| 2018/0245230 A1 * | 8/2018 | Sonoda | C25D 5/12 |
| 2018/0279482 A1 | 9/2018 | Ishii et al. | |
| 2018/0282890 A1 | 10/2018 | Chun et al. | |
| 2019/0145014 A1 * | 5/2019 | Chen | C25D 1/04 205/152 |
| 2019/0245014 A1 | 8/2019 | Park et al. | |
| 2019/0249322 A1 | 8/2019 | Lee et al. | |
| 2020/0096886 A1 * | 3/2020 | Sasaki | G03G 5/142 |

FOREIGN PATENT DOCUMENTS

| | | | |
|---|---|---|---|
| CN | 1788111 A | 6/2006 | |
| CN | 1995469 A | 7/2007 | |
| CN | 101098005 A | 1/2008 | |
| CN | 101669237 A | 3/2010 | |
| CN | 102203326 A | 9/2011 | |
| CN | 102234823 A | 11/2011 | |
| CN | 102418129 A | 4/2012 | |
| CN | 102965698 A | 3/2013 | |
| CN | 103911633 A | 7/2014 | |
| CN | 104125711 A | 10/2014 | |
| CN | 104603333 A | 5/2015 | |
| CN | 104717831 A | 6/2015 | |
| CN | 104781973 A | 7/2015 | |
| CN | 104812945 A | 7/2015 | |
| CN | 104884409 A | 9/2015 | |
| CN | 104928726 A | 9/2015 | |
| CN | 104992998 A | 10/2015 | |
| CN | 105323958 A | 2/2016 | |
| CN | 105556004 A | 5/2016 | |
| CN | 105814242 A | 7/2016 | |
| CN | 105934307 A | 9/2016 | |
| CN | 105986288 A | 10/2016 | |
| CN | 106103082 A | 11/2016 | |
| CN | 106304615 A | 1/2017 | |
| CN | 106455310 A | 2/2017 | |
| CN | 106455341 A | 2/2017 | |
| CN | 106455342 A | 2/2017 | |
| CN | 106558703 A | 4/2017 | |
| CN | 106953099 A | 7/2017 | |
| CN | 106982507 A | 7/2017 | |
| CN | 107018624 A | 8/2017 | |
| CN | 107041064 A | 8/2017 | |
| CN | 107801366 A | 3/2018 | |
| CN | 107871847 A | 4/2018 | |
| CN | 107946596 A | 4/2018 | |
| CN | 108124392 A | 6/2018 | |
| CN | 108270015 A | 7/2018 | |
| CN | 108306022 A | 7/2018 | |
| CN | 108345195 A | 7/2018 | |
| CN | 108690975 A | 10/2018 | |
| CN | 108728874 A | 11/2018 | |
| CN | 109788627 A | 5/2019 | |
| CN | 110004467 A | 7/2019 | |
| EP | 3067442 A1 | 9/2016 | |
| EP | 3312920 A1 | 4/2018 | |
| JP | 2000-045091 A | 2/2000 | |
| JP | 2000-119892 A | 4/2000 | |
| JP | 2001-192879 A | 7/2001 | |
| JP | 2002-194585 A | 7/2002 | |
| JP | 2002-298854 A | 10/2002 | |
| JP | 2004-002953 A | 1/2004 | |
| JP | 2004-250753 A | 9/2004 | |
| JP | 2006-253345 A | 9/2006 | |
| JP | 3850155 B2 | 11/2006 | |
| JP | 2010-282957 A | 12/2010 | |
| JP | 2011-192879 A | 9/2011 | |
| JP | 2012-136736 A | 7/2012 | |
| JP | 2012-172198 A | 9/2012 | |
| JP | 5-235542 B2 | 7/2013 | |
| JP | 2013-133514 A | 7/2013 | |
| JP | 2014-194067 A | 10/2014 | |
| JP | 2014-208910 A | 11/2014 | |
| JP | 5788062 B1 | 9/2015 | |
| JP | 2016-009526 A | 1/2016 | |
| JP | 2016125126 A | 7/2016 | |
| JP | 2016-160503 A | 9/2016 | |
| JP | 2016160503 | * 9/2016 | ............... C25D 1/00 |
| JP | 2017-025409 A | 2/2017 | |
| JP | 2017-038043 A | 2/2017 | |
| JP | 2017-203219 A | 11/2017 | |
| JP | 2018-026589 A | 2/2018 | |
| JP | 2018-028147 A | 2/2018 | |
| JP | 2018-123430 A | 8/2018 | |
| JP | 2018-524772 A | 8/2018 | |
| JP | 2018-165411 A | 10/2018 | |
| JP | 2018-178261 A | 11/2018 | |
| JP | 2019-099911 A | 6/2019 | |
| KR | 10-2012-0068834 A | 6/2012 | |
| KR | 10-1502373 B1 | 3/2015 | |
| KR | 10-2015-0062230 A | 6/2015 | |
| KR | 1020170046822 A | 5/2017 | |
| KR | 10-2018-0020927 A | 2/2018 | |
| KR | 10-2018-0080512 A | 7/2018 | |
| TW | 201139752 A | 11/2011 | |

(56) References Cited

FOREIGN PATENT DOCUMENTS

| | | |
|---|---|---|
| TW | 201219606 A | 5/2012 |
| TW | 201301641 A1 | 1/2013 |
| TW | 1417424 B | 12/2013 |
| TW | 201428139 A | 7/2014 |
| TW | 201512466 A | 4/2015 |
| TW | 1482882 B | 5/2015 |
| TW | 1501865 B | 10/2015 |
| TW | 201706459 A | 2/2017 |
| TW | 201716594 A | 5/2017 |
| TW | 201717712 A | 5/2017 |
| TW | 201718270 A | 6/2017 |
| TW | 201718937 A | 6/2017 |
| TW | 201722219 A | 6/2017 |
| TW | 201726961 A | 8/2017 |
| TW | 201738413 A | 11/2017 |
| TW | 201742212 A | 12/2017 |
| TW | 201809302 A | 3/2018 |
| TW | 201825717 A | 7/2018 |
| TW | 201829183 A | 8/2018 |
| TW | 201831733 A | 9/2018 |
| TW | 201832922 A | 9/2018 |
| TW | 201834303 A | 9/2018 |
| TW | 201837238 A | 10/2018 |
| TW | 201839147 A | 11/2018 |
| TW | 202030340 A | 8/2020 |
| WO | WO 2007/105635 A1 | 9/2007 |
| WO | 2008132987 A1 | 11/2008 |
| WO | WO 2018207786 A1 | 11/2008 |
| WO | 2014081041 A1 | 5/2014 |
| WO | WO 2014/065431 A1 | 5/2014 |
| WO | WO 2015/104999 A1 | 7/2015 |
| WO | WO 2017/00673 9 A1 | 1/2017 |
| WO | WO 2017/051767 A1 | 3/2017 |
| WO | WO 2018/110579 A1 | 6/2018 |
| WO | 2019027174 A1 | 2/2019 |

OTHER PUBLICATIONS

Gadelmawla et al., "Roughness Parameters", Jan. 14, 2002, Journal of Materials Processing Technology, 123 (2002) 133-145 (Year: 2002)*
Ficker et al., "Surface Roughness and Porosity of Hydrated Cement Pastes", 2011, Acta Polytechnica vol. 51 No. 3 (Year: 2011).*
Office Action in U.S. Appl. No. 16/429,921, dated Aug. 23, 2019.
Office Action in U.S. Appl. No. 16/694,434, dated Jan. 29, 2020.
Notice of Allowance in U.S. Appl. No. 16/584,157 dated Jan. 15, 2020.
Notice of Allowance in U.S. Appl. No. 16/429,921 dated Dec. 12, 2019.
Huang, Chein-Ho, et al., Pulsed Deposition of Ultra-thin Copper Foils; Plating & Surface Finishing, Sep. 2004, pp. 34-38.
U.S. Appl. No. 16/694,412, filed Nov. 25, 2019.
U.S. Appl. No. 16/715,284, filed Oct. 16, 2019.
Non-Final Office Action for U.S. Appl. No. 16/694,412, dated Feb. 10, 2020.
Non-Final Office Action for U.S. Appl. No. 16/715,284, dated Feb. 18, 2020.
Office Action for TW109101362 dated Mar. 18, 2020.
International Search Report for PCT/CN2020/072312 dated Mar. 26, 2020.
International Search Report for PCT/CN2020/072300 dated Mar. 24, 2020.
JP2020-004656 Notice of Reasons for Refusal dated Mar. 10, 2020.
KR10-2020-0005565 Office Action dated May 7, 2020.
EP20152064.0 European Search Report dated Jun. 5, 2020.
PCT/CN2020/072282 International Search Report dated Apr. 15, 2020.
PCT/CN2020/072305 International Search Report dated Apr. 13, 2020.
PCT/CN2020/072158 International Search Report dated Apr. 8, 2020.
PCT/CN2020/072157 International Search Report dated Apr. 21, 2020.
Wang, Hongcai et al., The Height Amplitudes of Surface Roughness based on Area-direction Character and Relative Assessed Indexes; Advanced Materials Research vols. 482-484 (2012) pp. 1150-1154; Trans Tech Publications, Switzerland.
KR Office Action for Application No. 10-2020-0005542, dated Oct. 26, 2020.
CN Office Action and Search Report for Application No. 202010040365.2, dated Nov. 9, 2020.
CN Office Action and Search Report for Application No. 202010040377.5, dated Nov. 12, 2020.
KR Office Action for Application No. 10-2020-0005476, dated Nov. 14, 2020.
TW Office Action and Search Report for Application No. 10921103320, dated Nov. 16, 2020.
CN Office Action and Search Report for Application No. 202010040373.7, dated Dec. 1, 2020.
KR Office Action for Application No. 10-2020-0005337 dated Dec. 1, 2020.
CN Office Action and Search Report for Application No. 202010040543.1, dated Dec. 18, 2020.
CN Office Action and Search Report for Application No. 202010044774.X, dated Dec. 21, 2020.
TW Notice of Allowance and Search Report for Application No. 109101364, dated May 25, 2020.
TW Notice of Allowance and Search Report for Application No. 109101373, dated Jun. 15, 2020.
European Search Report for Application No. EP20151885.9, dated Jun. 16, 2020.
TW Office Action and Search Report for Application No. 109101372, dated Jul. 10, 2020.
TW Office Action and Search Report for Application No. 109101285, dated Aug. 14, 2020.
JP Notice of Reasons for Refusal for Application No. 2020-004660, dated Aug. 18, 2020.
TW Notice of Allowance and Search Report for Application No. 109101360, dated Aug. 31, 2020.
TW Office Action and Search Report for Application No. 109101301, dated Sep. 4, 2020.
TW Office Action and Search Report for Application No. 109101355, dated Sep. 4, 2020.
KR Office Action for Application No. 10-2020-0005338, dated Sep. 7, 2020.
TW Office Action and Search Report for Application No. 109101361, dated Sep. 11, 2020.
TW Office Action and Search Report for Application No. 109101365, dated Sep. 16, 2020.
JP Office Action for Application No. 2020-004658, dated Oct. 8, 2020.
JP Notice of Reasons for Refusal in Application No. 2020-004661, dated Oct. 13, 2020.
JP Office Action for Application No. 2020-004659, dated Oct. 14, 2020.
CN Office Action for Application No. CN202010044774.X, dated May 6, 2021.
JP Office Action for Application No. JP2020-004657, dated Apr. 27, 2021.
JP Notice of Allowance for Application No. JP2020-014029, dated Apr. 27, 2021.
JP Office Action for Application NO. JP2020-0046660, dated Dec. 1, 2020.
KR Office Action for Application No. KR10-2020-0005338, dated Jan. 10, 2021.
KR Office Action for Application No. KR10-2020-0005565, dated Aug. 31, 2020.
KR Office Action for Application No. KR10-2020-0005565, dated Jan. 22, 2021.
KR Office Action for Application No. KR10-2021-0024954, dated May 7, 2021.
KR Office Action for Application No. KR10-2020-0005475, dated Apr. 29, 2021.

(56) References Cited

OTHER PUBLICATIONS

TW Office Action and Search Report for Application No. TW109101350, dated Apr. 12, 2021.
Office Action in U.S. Appl. No. 16/694,412, dated Apr. 22, 2020.
Office Action in U.S. Appl. No. 16/694,434, dated Apr. 22, 2020.
Office Action in U.S. Appl. No. 16/715,284, dated Apr. 22, 2020.
KR Office Action for Application No. KR10-2020-0005337, dated Dec. 1, 2020.
KR Office Action for Application No. KR10-2020-0005338, dated Sep. 7, 2020.
KR Office Action for Application No. KR10-2020-0005476, dated Nov. 14, 2020.
KR Office Action for Application No. KR10-2020-0005542, dated Oct. 26, 2020.
KR Office Action for Application No. KR10-2020-0005565, dated May 7, 2020.
KR Notice of Allowance for Application No. KR10-2021-7003753, dated May 31, 2021.
TW Office Action for Application No. TW109101297, dated Jun. 7, 2021.
KR Office Action for Application No. KR10-2020-0011008, dated Jul. 1, 2021.
JP Office Action for Application No. JP2021-506268, dated Aug. 3, 2021.

\* cited by examiner

SURFACE TREATED COPPER FOIL

CROSS REFERENCE TO RELATED APPLICATIONS

This application claims the benefit under 35 U.S.C. § 119(e) of U.S. Provisional Application No. 62/800,263 filed Feb. 1, 2019, the contents of which are incorporated herein by reference in their entirety.

FIELD OF THE INVENTION

The present disclosure relates to electrodeposited copper foils having controlled surface properties. The disclosure also relates to circuit boards and the like which exhibit low transmission loss of electrical signals and which incorporate the electrodeposited copper foils as a component thereof.

BACKGROUND

The increasing demands for transmitting massive data requires ever increasing signal transmission speeds between components on circuit boards. To achieve these speeds, frequency ranges are necessarily increasing from below 1 MHz to, 1 GHz, 10 GHz or even higher. In these higher ranges, the currents flow mostly near the surface of the conductor due to the well-known "skin effect" which is the tendency of high frequency current density to be highest at the surface of a conductor and to decay exponentially towards the center. The skin depth, where approximately 67% of the signal is carried, is inversely proportional to the square root of the frequency. Accordingly, at 1 MHz the skin depth is 65.2 µm, at 1 GHz it is 2.1 µm, while at 10 GHz the skin depth is only 0.7 µm. At the higher frequencies, the surface topography or roughness of the conductor becomes ever more important since a roughness on the order of, or greater than, the skin depth will impact the signal transmission through scattering.

An exacerbating factor is that usually the surface of the conductor in printed circuit boards are intentionally roughened to enhance adhesion characteristics to the resin layer used in the laminated structures of circuit boards. A surface roughness, Rz, on the roughened surface on the order of several µm is typical and will impact any transmission in the GHz range. The design is therefore constrained by the conflicting need for high roughness to ensure enough adhesion, and low roughness to minimize transmission loss. One approach to try and provide control of the surface topography is to roughen either the deposition side or the drum side of an electrodeposited copper foil. The deposition side is typically rougher than the drum or "shiny" side. In a normal treated foil, the deposition side is roughened and adhesion to the resin layer is superior since the roughness is typically higher. In order to maintain the quality of signal transmission, reverse treated foil (RTF) has been developed. RTF is roughened at its shiny side, so that roughness is decreased and can reduce transmission loss of signal.

Although RTF technologies provide an improvement with regards to transmission loss, the smooth surface of copper foil results in poor peel strength to the resin layer, so that the copper foil can easily detach from the resin layer when processing or afterwards.

There therefore remains a need for copper foils with low transmission loss and good adhesion strength for the manufacturing of circuit boards.

SUMMARY

In general, the disclosure herein relates to a copper foil such as electrodeposited copper foils that can be used as a conductor in a circuit board. Copper foils have been prepared having controlled surface properties that provide for low transmission loss even at high frequencies and high adhesion to the resin layer in the circuit board.

In a first aspect, the disclosure provides a surface-treated copper foil comprising an electrodeposited copper foil including a drum side and a deposited side, and a treatment layer disposed on the drum side providing a surface-treated side, wherein the treatment layer comprises a nodule layer. The surface-treated side exhibits a void volume (Vv) in a range of 0.4 to 2.2 $\mu m^3/\mu m^2$ and an arithmetic mean waviness (Wa) lower than or equal to 0.4 µm.

Optionally, the surface-treated side exhibits an arithmetic mean waviness (Wa) in a range of 0.1 to 0.4 µm. Optionally, the surface-treated side exhibits a core void volume (Vvc) in a range of 0.4 to 2 $\mu m^3/\mu m^2$. Optionally, the surface-treated side exhibits a dale void volume (Vvv) in a range of 0.01 to 0.1 $\mu m^3/\mu m^2$.

In some options, the surface-treated side exhibits a reflectance at 700 nm in a range of 28% to 76%. Optionally, the reflectance at 700 nm is greater than 40% or in the range of 40% to 70%.

In some other options, the treatment layer further comprises at least one of a barrier layer, an anti-tarnish layer, and a coupling layer. Optionally, the barrier layer is made of metal or an alloy containing the metal, and the metal is selected from at least one of Ni, Zn, Cr, Co, Mo, Fe, Sn, and V. Optionally the coupling layer includes silicon. Also optionally, the nodule layer comprises copper nodules.

In a second aspect, the disclosure provides a laminate comprising a resin layer and a surface-treated copper foil. The surface-treated copper foil comprises an electrodeposited copper foil including a drum side and a deposited side, and a treatment layer disposed on the drum side providing a surface-treated side in contact with the resin layer, and wherein the treatment layer comprises a nodule layer. The surface-treated side exhibits a void volume (Vv) in a range of 0.4 to 2 $\mu m^3/\mu m^2$, an arithmetic mean waviness (Wa) in a range of 0.1 to 0.4 µm, a core void volume (Vvc) in a range of 0.4 to 2 $\mu m^3/\mu m^2$, a dale void volume (Vvv) in a range of 0.01 to 0.1 $\mu m^3/\mu m^2$, and a surface reflectance at 700 nm in a range of 40% to 70%.

In a third aspect, the disclosure provides a device comprising a circuit board including the surface-treated copper foil according to the first aspect, and a plurality of components mounted on the circuit board. At least a first component and a second component of the plurality of components are electrically connected to each other through the surface-treated copper foil of the circuit board.

The above summary is not intended to represent every embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure will be better understood from the following description of exemplary embodiments together with reference to the accompanying drawings.

The present disclosure is susceptible to various modifications and alternative forms. Some representative embodiments have been shown by way of example in the drawings and will be described in detail herein. It should be understood, however, that the inventions are not intended to be limited to the particular forms disclosed. Rather, the disclosure is to cover all modifications, equivalents, and alternatives falling within the spirit and scope of the inventions as defined by the appended claims.

DETAILED DESCRIPTION

Surface-treated copper foils are described that exhibit low transmission loss. The surface-treated copper foils have controlled surface characteristics such as void volumes and waviness. Such surface-treated copper foil can be useful for the production of articles needing low transmission loss of electrical signals, such as printed circuit boards or any thin copper foil covering an insulator.

Figure 1:
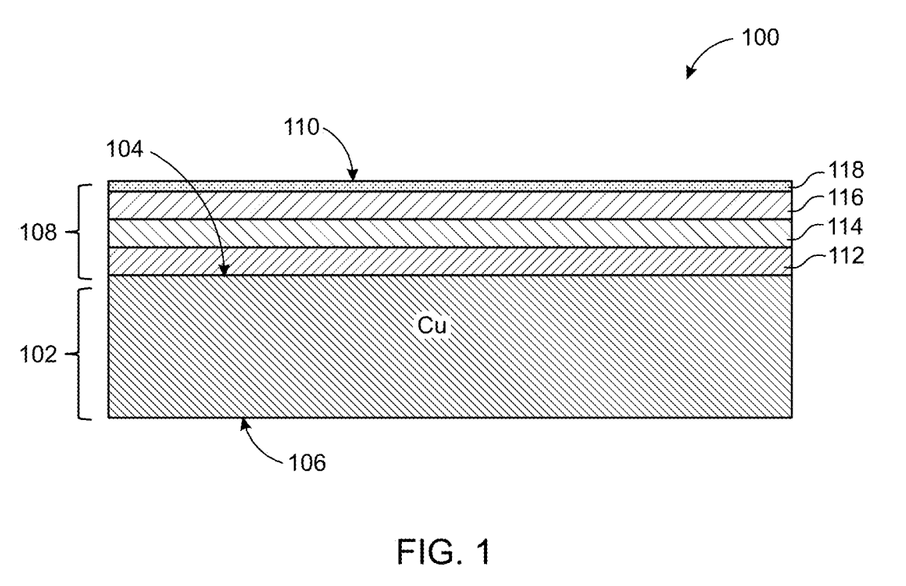
FIG. 1 shows a surface-treated copper foil according to some embodiments.

FIG. 1 shows a schematic cross-sectional view of an embodiment of a surface-treated copper foil 100, which includes an electrodeposited copper foil 102 and a treatment layer 108. The electrodeposited copper foil 102 has a drum side 104 and a deposited side 106. The treatment layer 108 is disposed on the drum side 104 and provides a surface-treated side 110.

As used herein the "drum side" or "shiny side" of the electrodeposited copper foil is the surface of the electrodeposited copper foil that is in contact with a cathode drum used during the electrodeposition, while the "deposited side" is the opposite side to the drum side, or the surface of the electrodeposited copper foil that is in contact with an electrolyte solution during the electrodeposition forming the electrodeposited copper foil. These terms relate to a manufacturing process for producing electrodeposited copper foils which include partially immersing the rotating cathode drum assembly into the electrolyte solution containing copper ions. Therefore, under operation of an electric current, copper ions are drawn to the cathode drum and reduced, resulting in copper metal plating onto the surface of the cathode drum forming an electrodeposited copper foil on the surface of the cathode drum. This electrodeposited copper foil is formed and removed from the cathode drum in a continuous process by rotating the cathode drum and removing the electrodeposited copper foil as the formed copper foil rotates with the cathode drum out of the electrolyte solution. For example, the electrodeposited copper foil can be pulled off the cathode drum as it is formed by, and passed over or through rollers in a continuous process.

The electrodeposited copper foil 102 can be further treated on its drum side 104 and/or deposited side 106 with a surface treatment, forming a treatment layer. As shown in FIG. 1, the drum side 104 is covered with the treatment layer 108, providing the surface-treated side 110, which is the exterior surface of the treatment layer 108. The surface treatment can include one or more treatments such as a roughening treatment to provide a nodule layer 112, a passivation treatment to provide a barrier layer 114, an anti-tarnishing treatment to provide an anti-tarnish layer 116, and a coupling treatment to provide a coupling layer 118. Therefore, in the embodiment shown in FIG. 1, the nodule layer 112, barrier layer 114, anti-tarnish layer 116, and coupling layer 118 are sub-layers of the treatment layer 108. The surface treatment and specific sub layers of treatment layer 108 shown in the figure are an embodiment, and other surface treatments and other sub layers in addition to or as alternatives thereof can be used in some other embodiments. Accordingly, one or more than one of the sub-layers may be present in the different embodiments of the treatment layer 108.

By controlling the surface properties of the surface-treated side 110, good adhesion can be achieved while maintaining good transmission loss at high frequencies. For example, the surface-treated side 110 can have controlled surface properties as characterized by void volume parameters, waviness and reflectance.

Figure 2:
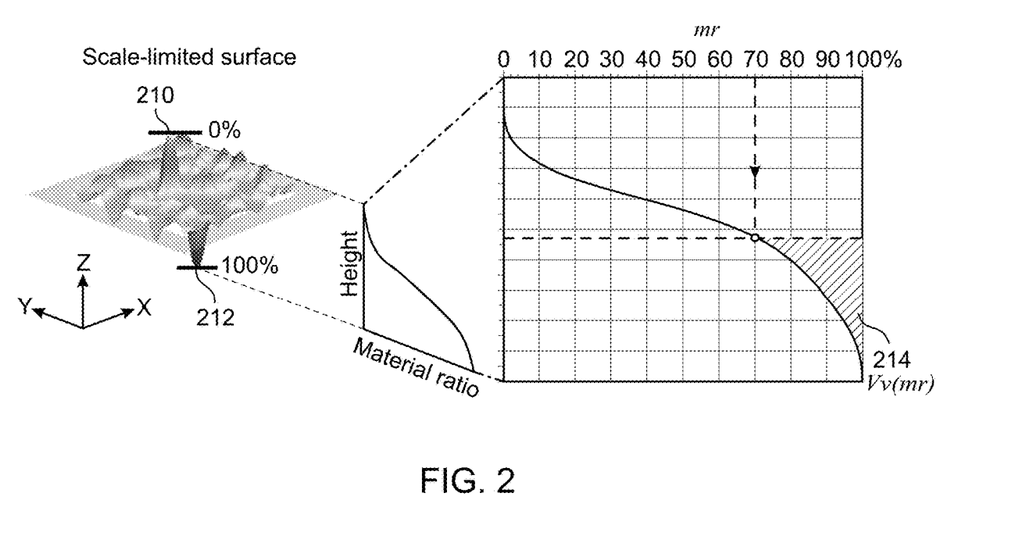
FIG. 2 shows a 3D surface plot and an areal material ratio plot.

The void volume parameters as defined herein are illustrated with reference to FIG. 2, which shows a 3D surface and the derivation of the areal material plot for obtaining volume parameters. FIG. 2, left side, is a three-dimensional graphic representation of the surface geometry of a surface, such as a drum side or a deposited side of an electrodeposited copper foil. FIG. 2, right side shows the derivation of an areal material ratio curve as can be obtained by using the ISO Standard Method ISO 25178-2:2012, which spans a material ratio (mr) of 0%, at the top of the highest peak 210, to the lowest valley 212 at which the mr is 100%. The void volume (Vv) is calculated by integrating the volume of the voids enclosed above the surface and below a horizontal cutting plane set at a height corresponding to a specified material ratio (mr) between 0% (the top of the peak 210) and 100% (the bottom of the valley 212). For example, the Vv at 70% mr is shown as the shaded area 214 on the right side plot of FIG. 2.

Figure 3:
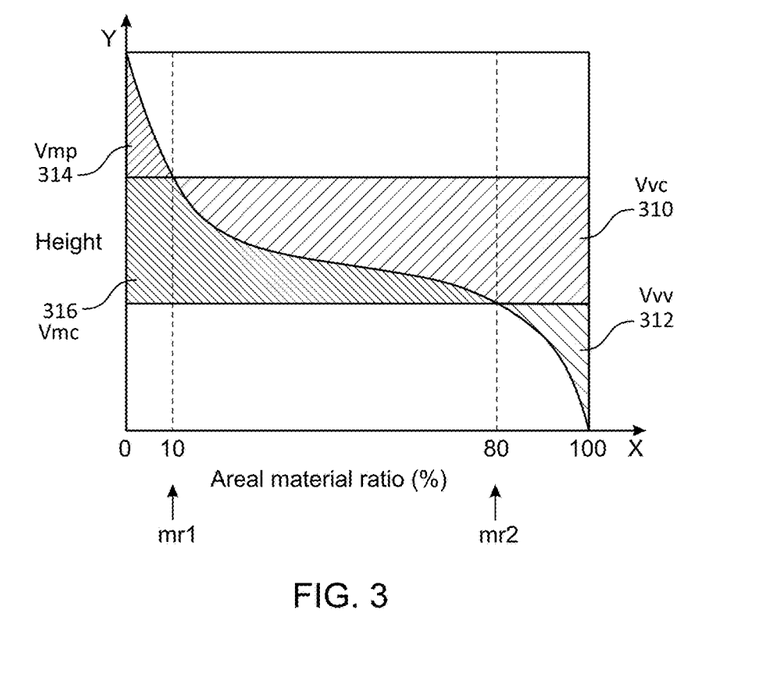
FIG. 3 shows details of an areal material ratio plot.

FIG. 3 shows more details of an areal material ratio plot with some relationships regarding different kinds of volume parameters defined. The core void volume (Vvc) is the difference in void volume between two material ratios (mr), such as mr1 and mr2, shown as area 310. For example, Vvc can be chosen where mr1 is 10% and mr2 is 80%. The dale void volume (Vvv), which is also called valley void volume, is the void volume at a specified mr value, such as mr at 80%, shown as area 312. The void volume (Vv) at mr1 is the sum of the core void volume (Vvc) between mr1 and mr2, area 310, and the dale void volume (Vvv), area 312, at mr2. Other regions include the peak material volume (Vmp), area 314, and the core material volume (Vmc), area 316. As used herein values listed for the void volume (Vv) is for the Vv at mr=10% unless otherwise specified. As used herein values listed for the core void volume (Vvc), unless otherwise specified, are the values calculated for the difference between material ratios when the material ratios are chosen at mr1=10% and mr2=80%, as shown in FIG. 3. As used herein values for the dale void volume (Vvv), unless otherwise specified, are the values at mr=80%.

Figure 4:
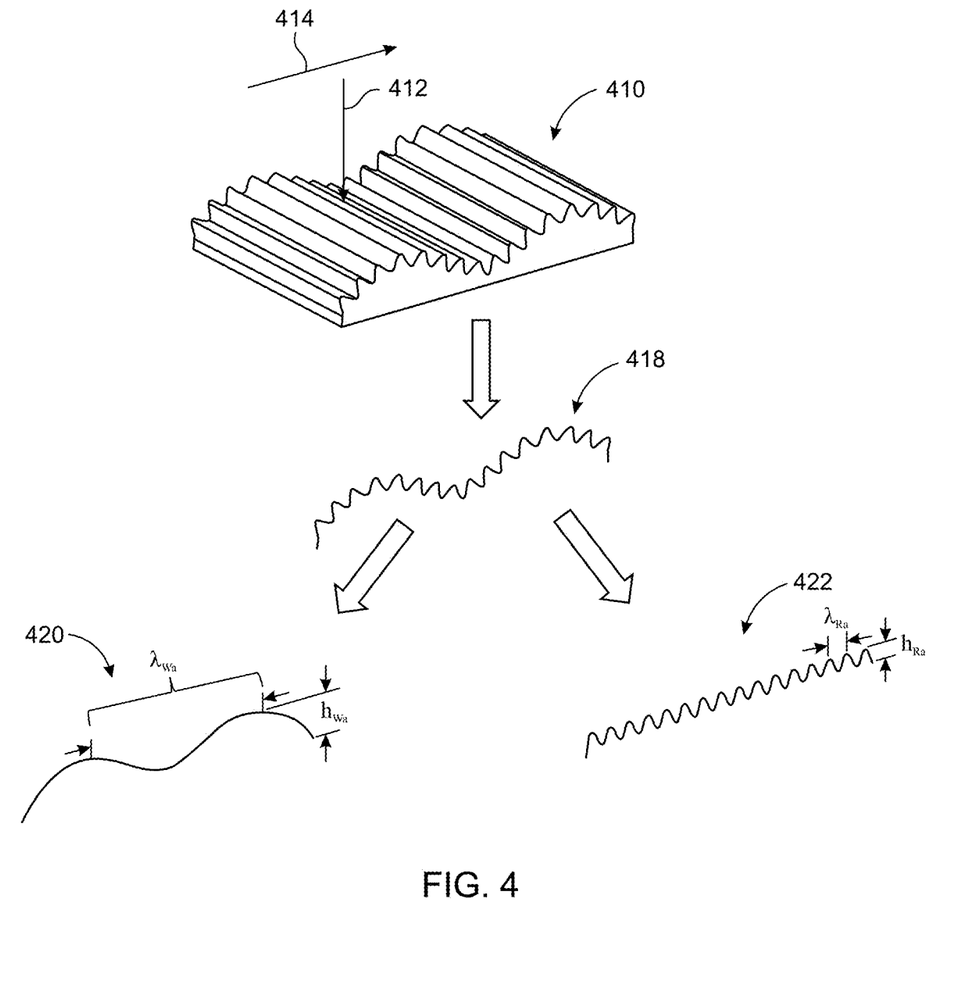
FIG. 4 shows roughness and waviness of a surface.

As used herein "waviness" relates to irregularities whose spacing is greater than a roughness sampling length. This is illustrated with reference to FIG. 4 which shows a sample, such as of a copper foil, 410. A surface profile of the sample 410 can be probed, for example by dragging a mechanical stylus 412 of a profiling instrument across a surface of the sample in the sampling direction 414. The profile 418 in the sampling direction 414 is shown which can be partitioned into a waviness profile 420 or a roughness profile 422. The wavelength of the waviness profile $\lambda_{Wa}$ is larger than the wavelength of the Ra profile, $\lambda_{Ra}$. Although the height of the waviness profile, $h_{wa}$, is shown in FIG. 4 to be greater than the height of the roughness profile, $h_{ra}$, this is not necessary for the distinction between waviness and roughness. That is, $h_{wa}$ and $h_{ra}$ can be the same, $h_{wa}$ can be greater than $h_{ra}$, or $h_{wa}$ can be smaller than $h_{ra}$. The waviness profile 420 and the roughness profile 422 can be distinguished by setting a filter (λc) to the profile 418. The high pass signals can be viewed as the roughness profile 422, and the low pass signals can be viewed as the waviness profile 420. The filter (λc) is often set at 0.8 μm based on JIS B 0601-2013 4.2.1. Alternatively, the measurement method itself may only provide a waviness or roughness profile depending, for example, on the resolution limitations of the measurement probe. The "arithmetic mean waviness" (Wa) is defined herein according to JIS B 0601-2013 4.2.1.

The "reflectance" refers to the effectiveness of a surface of a material in reflecting radiant energy and can be expressed as the fraction of the incident electromagnetic power that is reflected from the surface, such as a percentage (Reflectance %). The reflectance is a function of the incident radiations wavelength or energy, since at some wavelengths the energy is absorbed rather than reflected by a particular material. For example, copper absorbs light having wavelengths between 200 nm and 650 nm, while it reflects light at 700 nm. In addition, the reflectance is a function of the surface topography since features on the surface that are close to the wavelength of the incident radiation can scatter the radiation rather than reflect it. Therefore, reflectance is a measurable property of a reflecting surface that can characterize and define the surface.

In some embodiments, the surface-treated copper foil 100 has a Vv on the surface-treated side 110, in a controlled range between a low and a high value, such as between a low value of about 0.4 ($\mu m^3/\mu m^2$) and a high value of about 2.2 ($\mu m^3/\mu m^2$). When Vv is too small, such as less than about 0.4 ($\mu m^3/\mu m^2$), the adhesion of the electrodeposited copper foil to the resin layer is poor due to weak anchor effect. That is, the material cannot anchor to the surface very well so adherence is poor. If Vv is too large, such as above about 2.2 ($\mu m^3/\mu m^2$), the transmission loss becomes too high.

In the embodiments where a Vv value in the range of 0.4 to 2.20 ($\mu m^3/\mu m^2$) are described for the surface-treated side 110 of the surface-treated copper foil 100, it is to be expressly understood that these ranges are continuous and could be represented as: 0.40, 0.41, 0.42, 0.43, 0.44, 0.45, 0.46, 0.47, 0.48, 0.49, 0.50, 0.51, 0.52, 0.53, 0.54, 0.55, 0.56, 0.57, 0.58, 0.59, 0.60, 0.61, 0.62, 0.63, 0.64, 0.65, 0.66, 0.67. 0.68, 0.69, 0.70, 0.71, 0.72, 0.73, 0.74, 0.75, 0.76, 0.77, 0.78, 0.79, 0.80, 0.81, 0.82, 0.83, 0.84, 0.85, 0.86, 0.87. 0.88, 0.89, 0.90, 0.91, 0.92, 0.93, 0.94, 0.95, 0.96, 0.97. 0.98, 0.99, 1.00, 1.01, 1.02, 1.03, 1.04, 1.05, 1.06, 1.07, 1.08, 1.09, 1.10, 1.11, 1.12, 1.13, 1.14, 1.15, 1.16, 1.17, 1.18, 1.19, 1.20, 1.21, 1.22, 1.23, 1.24, 1.25, 1.26, 1.27, 1.28, 1.29, 1.30, 1.31 1.32, 1.33, 1.34, 1.35, 1.36, 1.37, 1.38, 1.39, 1.40, 1.41, 1.42, 1.43, 1.44, 1.45, 1.46, 1.47, 1.48, 1.49, 1.50, 1.51, 1.52, 1.53, 1.54, 1.55, 1.56, 1.57. 1.58, 1.59, 1.60, 1.61, 1.62, 1.63, 1.64, 1.65, 1.66, 1.67, 1.68, 1.69, 1.70, 1.71, 1.72, 1.73, 1.74, 1.75, 1.76, 1.77. 1.78, 1.79, 1.80, 1.81, 1.82, 1.83, 1.84, 1.85, 1.86, 1.87, 1.88, 1.89, 1.90, 1.91, 1.92, 1.93, 1.94, 1.95, 1.96, 1.97, 1.98, 1.99, 2.00, 2.01, 2.02, 2.03, 2.04, 2.05, 2.06, 2.07, 2.08, 2.09, 2.10, 2.11, 2.12, 2.13, 2.14, 2.15, 2.16, 2.17, 2.18, 2.19 and 2.20 ($\mu m^3/\mu m^2$), with each of these values representing an endpoint in a range of values.

In some embodiments, core void values (Vvc) for the surface-treated side 110 of the surface-treated copper foil 100 lie in the range of 0.4 to 2 ($\mu m^3/\mu m^2$). It is to be expressly understood that these ranges are continuous and could be represented as: 0.40, 0.41, 0.42, 0.43, 0.44, 0.45, 0.46, 0.47, 0.48, 0.49, 0.50, 0.51, 0.52, 0.53, 0.54, 0.55, 0.56, 0.57, 0.58, 0.59, 0.60, 0.61, 0.62, 0.63, 0.64, 0.65, 0.66, 0.67. 0.68, 0.69, 0.70, 0.71, 0.72, 0.73, 0.74, 0.75, 0.76, 0.77, 0.78, 0.79, 0.80, 0.81, 0.82, 0.83, 0.84, 0.85, 0.86, 0.87. 0.88, 0.89, 0.90, 0.91, 0.92, 0.93, 0.94, 0.95, 0.96, 0.97. 0.98, 0.99, 1.00, 1.01, 1.02, 1.03, 1.04, 1.05, 1.06, 1.07, 1.08, 1.09, 1.10, 1.11, 1.12, 1.13, 1.14, 1.15, 1.16, 1.17, 1.18, 1.19, 1.20, 1.21, 1.22, 1.23, 1.24, 1.25, 1.26, 1.27, 1.28, 1.29, 1.30, 1.31 1.32, 1.33, 1.34, 1.35, 1.36, 1.37, 1.38, 1.39, 1.40, 1.41, 1.42, 1.43, 1.44, 1.45, 1.46, 1.47, 1.48, 1.49, 1.50, 1.51, 1.52, 1.53, 1.54, 1.55, 1.56, 1.57. 1.58, 1.59, 1.60, 1.61, 1.62, 1.63, 1.64, 1.65, 1.66, 1.67, 1.68, 1.69, 1.70, 1.71, 1.72, 1.73, 1.74, 1.75, 1.76, 1.77. 1.78, 1.79, 1.80, 1.81, 1.82, 1.83, 1.84, 1.85, 1.86, 1.87, 1.88, 1.89, 1.90, 1.91, 1.92, 1.93, 1.94, 1.95, 1.96, 1.97, 1.98, 1.99 and 2.00 ($\mu m^3/\mu m^2$), with each of these values representing an endpoint in a range of values.

In some embodiments, the surface-treated copper foil 100 exhibits a dale void volume (Vvv) for the surface-treated side 110 in the range of 0.01 to 0.10 ($\mu m^3/\mu m^2$). It is to be expressly understood that these ranges are continuous and could be represented as: 0.01, 0.02, 0.03, 0.04, 0.05, 0.06, 0.07, 0.08, 0.09 and 0.10 ($\mu m^3/\mu m^2$), with each of these values representing an endpoint in a range of values.

In some embodiments, the surface-treated copper foil 100 exhibits a Wa for the surface-treated side 110 in a controlled range between a low and high value, such as between the range of 0.1 to 0.4 μm. When Wa is too large, such as above about 0.4 μm, the transmission loss becomes too high. It is to be expressly understood that these ranges are continuous and could be represented as: 0.10, 0.11, 0.12, 0.13, 0.14, 0.15, 0.16, 0.17, 0.18, 0.19, 0.20, 0.21, 0.22, 0.23, 0.24, 0.25, 0.26, 0.27, 0.28, 0.29, 0.30, 0.31, 0.32, 0.33, 0.34, 0.35, 0.36, 0.37, 0.38, 0.39 and 0.40 μm, with each of these values representing an endpoint in a range of values.

In some embodiments, the surface-treated copper foil 100 exhibits a reflectance at 700 nm for the surface-treated side 110 in the range of 28% to 76%. It is to be expressly understood that these ranges are continuous and could be represented as: 28, 29, 30, 31, 32, 33, 34, 35, 36, 37 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75 and 76%, with each of these values representing an endpoint in a range of values.

In some embodiments the nodule layer, such as nodule layer 112, can include metal nodules such as copper nodules. The nodules can be formed, for example, by electroplating the metal onto the foil. In some embodiments, the copper nodules can be made of copper or copper alloy. In some embodiments the nodule layer can have a thickness greater than about 1 μm. In some embodiments the combined thickness of the barrier layer, anti-tarnish layer, and coupling layer are less than about 0.1 μm. In some embodiments the nodule layer includes a metal covering on the metal nodules, such as a copper deposition on copper nodules. For example, the metal covering can help to prevent exfoliation of the metal nodules.

As used herein the "barrier layer" is a layer made of metal or alloy containing the metal. In some embodiments the barrier layer, such as barrier layer 114, is made of at least one metal selected from zinc (Zn), chromium (Cr), nickel (Ni), cobalt (Co), molybdenum (Mo), vanadium (V), iron (Fe), tin (Sn), and combinations thereof. In some embodiments the barrier layer comprises Ni. In some embodiments the barrier layer comprises Zn. In some embodiments the barrier layer comprises a Ni layer and a Zn layer.

As used herein an "anti-tarnish layer," such as anti-tarnish layer 116, is a coating applied to a metal that can protect the coated metal from degradation such as due to corrosion. In some embodiments, the anti-tarnish layer comprises a metal or an organic compound. For example, chromium or chromium alloys can be used as a metal coating on the electrodeposited copper foil. When the anti-tarnish layer is made of chromium alloy, it further contains any one or more of zinc (Zn), nickel (Ni), cobalt (Co), molybdenum (Mo), and vanadium (V). In some embodiments where the anti-tarnish layer is made of organics, the layer may comprise at least one member selected from the group consisting of triazoles, thiazoles, and imidazoles, or their derivatives. The triazole group includes but is not limited to orthotriazole (1,2,3-triazole), benzotriazole, tolyltriazole, carboxybenzotriazole, chlorine substituted benzotriazole, 3-amino-1,2,4-triazole, 2-amino-1,3,4-triazole, 4-amino-1,2,4-triazole, 1-amino-1,3,4-triazole, and isomers thereof, or derivatives thereof. The thiazole group includes but not limits to thiazole, 2-mercaptobenzothiazole, dibenzothiazyldisulfide, and isomers thereof, or derivatives thereof. The imidazole group includes but not limits to imidazole, 2-methylimidazole, 2-ethyl-4-methylimidazole, 2-phenylimidazole, 1-benzyl-2-methyl-imidazole, and isomers thereof, or derivatives thereof.

As used herein the "coupling layer," such as coupling layer 118, is a layer that is added to improve the binding between the copper foil and a resin layer, for example a resin layer used in the manufacture of circuit boards. In some embodiments this is provided by a silane treatment which provides a layer including silicon and oxygen. The silane can be exemplified but not limited to amino-based silane, epoxy-based silane, and mercapto-based silane. The silane may be selected from vinyltrimethoxysilane, vinyltriethoxysilane, 2-(3,4-epoxycyclohexyl)ethyltrimethoxysilane, 3-glycidoxypropyl methyldimethoxysilane, 3-glycidoxypropyl trimethoxysilane, 3-glycidoxypropyl methyldiethoxysilane, 3-glycidoxypropyl triethoxysilane, p-styryltrimethoxysilane, 3-methacryloxypropyl methyldimethoxysilane, 3-methacryloxypropyl trimethoxysilane, 3-methacryloxypropyl methyldiethoxy silane, 3-methacryloxypropyl triethoxysilane, 3-acryloxypropyl trimethoxysilane, N-2-(aminoethyl)-3-aminopropylmethyldimethoxysilane, N-2-(aminoethyl)-3-aminopropyltrimethoxysilane, 3-aminopropyltrimethoxysilane, 3-aminopropyltriethoxysilane, partially hydrolyzates of 3-triethoxysilyl-N-(1,3-dimethyl-butylidene)propylamine, N-(vinylbenzyl)-2-aminoethyl-3-aminopropyltrimethoxysilane hydrochloride, N-phenyl-3-aminopropyltrimethoxysilane, N-(vinylbenzyl)-2-aminoethyl-3-aminopropyltrimethoxysilane hydrochloride, tris-(trimethoxysilylpropyl)isocyanurate, 3-ureidopropyltrialkoxysilane, 3-mercaptopropylmethyldimethoxysilane, 3-mercaptopropyltrimethoxysilane, and 3-isocyanatepropyltriethoxysilane, but not limited thereof.

In some embodiments the sub-layers, such as the sub-layers of treatment layer 108, are provided so that the nodule layer 112 is covered with the barrier layer 114, the barrier layer 114 is covered with the anti-tarnish layer 116 and the anti-tarnish layer 116 is covered with the coupling layer 118; however, according to other embodiments, the stacking order or number of the sub-layers is not limited therein. In the embodiment shown by FIG. 1, the final physical surface of the surface treated side 110 is therefore provided by the coupling layer 118 which can then be coupled to a resin layer in a laminate structure. In some embodiments, the surface roughness of surface-treated side 110, such as Vv, Vvc, and Vvv, is dominated by the nodule layer 112, since barrier layer 114, anti-tarnish layer 116, and coupling layer 118 in any combination can be much thinner than the nodule layer 112.

In some embodiments, the surface-treated copper foil such as 100 and a resin layer are combined to form a laminated structure. The structure can include two or more layers of alternating copper foil and resin layer. These can be formed, for example, by stacking alternate sheets of the copper foil, at least one being a surface-treated copper foils 100, and a resin layer, and compressing the stack together using a press while heating the stack. In some embodiments, the resin layer is contacted with the surface-treated side 110 of the surface treated copper foil 100. Where more than three conductive layers, e.g., at least one being a surface-treated copper foil 100, are alternated with resin layers, the laminate is a multilayer structure such as can be used to make a multilayer PCB (printed circuit board).

As used herein a "resin" relates to an organic polymeric material that can be formed as a sheet or layer on a substrate such as a surface-treated copper foil. Some examples of a resin include phenolic resins, epoxy resins, polyester resins (e.g., polyethylene terephthalates), polyimide resins, acrylics, formaldehyde resins, bismaleimide triazine resins, cyanate ester resin, fluoropolymers, poly ether sulphone, cellulosic thermoplastics, polycarbonate, polyolefins, polypropylene, polysulfide and polyurethane. The resins can also include filler materials or reinforcing materials such as aramide, carbon, glass, cellulosic and inorganic materials, all of these optionally in the form of particles, fibers, chopped fibers, woven materials or a webbing. In some embodiments the resin is formed into a sheet using one or more of the resins and one or more of the filler materials in a composite sheet. In some embodiments one or more resin layers are stacked on top of each other and in direct contact to provide a multi-stack resin layer sometimes referred to a multiple board. As used herein a resin layer can refer to a multi-stack resin layer such as a multiple board.

In some embodiments the surface-treated copper foil 100 is used to produce a circuit board (e.g., a printed circuit board or PCB). For example, a circuit board formed using a laminate of the copper foil and a resin layer. Further processing such as the production of conducting lines or tracks, contact pads, shielding areas, and conduction vias can be achieved by known processing methods such as lithography, copper etching, and drilling of the copper foil/resin laminate. Components, such as batteries, resistors, LEDs, relays, transistors, capacitors, inductors, diodes, switches, microcontrollers, crystals and oscillators, and integrated circuit can be mounted (e.g., mechanically and electrically connected) to the circuit board by known methods. For example, surface mount methods or the through-hole methods to attach the components, and pick and place technologies for assembly.

In some embodiments the surface-treated copper foil 100 can be used for making a circuit board, including a plurality of components mounted on the circuit board, that is used in a device. As used herein a device comprises any item or component for processing an electric signal such as by manipulation of the voltage, current, frequency or power of the signal. For example, and without limitation, a computer such as used in a laptop, desktop, vehicles, phones, measurement and monitoring devices (e.g., glucose meter, pH meter, air monitoring device), data output devices (e.g., monitors, printers), input devices (touch screens, keyboards, mouse), and wireless transmission/receiving devices such as Wi-Fi, Zigbee and Bluetooth.

It should be understood within the scope of the present disclosure, the above-mentioned technical features and technical features mentioned below (such as examples) can be combined freely and mutually to form new or preferred technical solutions, which are omitted for brevity.

EXAMPLES

General Copper Foil Preparation

Drum Buff

The system for manufacturing the electrodeposited copper foil includes a metal cathode drum and an insoluble metal anode. The metal cathode drum is rotatable and has a polished surface. In this system, the insoluble metal anode is arranged at approximately the lower half of the metal cathode drum and surrounds the metal cathode drum. The electrodeposited copper foil is manufactured using continuous electrodeposition by flowing the copper sulfate electrolyte solution between the metal cathode drum and the insoluble metal anode, applying an electrical current between these to allow copper ions to be drawn to the metal cathode drum and reduced causing electrodeposited copper on the metal cathode drum forming the electrodeposited copper foil, and detaching the electrodeposited copper foil from the metal cathode drum when a predetermined thickness is obtained.

Due to immersing in acid solution, the surface of the titanium drum is gradually corroded (oxidized) which can result in an uneven or inferior surface, which can impact the surface properties of the copper foil produced. Therefore, polishing the surface of titanium drum is an effective method to control the copper foil properties, such as roughness. Polishing can be especially effective on modifying the surface properties on the drum side of the copper foil. Accordingly, prior to electrodeposition of copper on the drum, the drum is polished using a cylindrical buff that is rotated and contacted with the drum, as the drum itself is rotated. Conditions can vary providing a different surface finish on the drum, which concomitantly provides a different surface finish on the electrodeposited copper foil, especially on the drum side. Some exemplary conditions are Drum speed 3 m/min circumferential speed, Buff #500, 1000, 1500, 2000 and 2500 (Buffs available from Nippon Tokushu Kento Co., Ltd), and buff speed between 150 and 450 m/min circumferential speed. The rotation of the drum and cylindrical buff are coupled so that the tangential direction vector at a point of contact is in the same direction. For example, if the drum rotates in a counterclockwise direction, the cylindrical buff rotates in a clockwise direction, and if the drum rotates in a clockwise direction, the cylindrical buff rotates in a counterclockwise direction. Table 1 below lists exemplary conditions.

Electrodeposited Copper Foil Preparation.

Copper wire was dissolved in an aqueous solution of sulfuric acid (50 wt %) to prepare a copper sulfate electrolyte solution which contained 320 g/L of copper sulfate ($CuSO_4 \cdot 5H_2O$) and 100 g/L of sulfuric acid. Hydrochloric acid (obtained from RCI Lab scan Ltd) was added to provide a chloride ion concentration of 20 mg/L in the copper sulfate electrolyte solution. 0.35 mg/L of gelatin (SV, Nippi Company) as also added.

After the buffing step and preparation of the copper containing electrolyte, electrodeposited copper foil was prepared by electrodeposition. During the electrodeposition, the liquid temperature of the copper sulfate electrolyte solution was maintained at about 50° C., and the current density was maintained at about 70 A/dm'. Electrodeposited copper foils having a thickness of about 35 μm were prepared.

Surface Treatment.

In a first step for the roughening treatment, after preparing the electrodeposited copper foil as outlined above, the electrodeposited copper foil is cleaned by using an acid solution. An acid washing vessel was used for this procedure where the vessel was filled with an electrolyte containing 130 g/L copper sulfate and 50 g/L sulfuric acid and a temperature of about 27° C. was maintained for the solution. The electrodeposited copper foil was directed into an acid washing vessel where it was soaked into the electrolyte for 30 seconds to remove the oil, fat and oxide on the surface. The electrodeposited copper foil was then rinsed with water.

The nodule layer was then formed by electroplating on the surface of the drum side of the electrodeposited copper foil. For plating the nodule layer, a copper sulfate solution was used as the plating electrolyte which contains 70 g/L of copper sulfate, 100 g/L of sulfuric acid, 250 mg/L sodium tungstate ($NaWO_4$), 2000 mg/L of ferrous sulfate ($FeSO_4$), and 10 mg/L Saccharin (1,1-dioxo-1,2-benzothiazol-3-one, manufactured by Sigma-Aldrich Company). As shown in Table 1, other additive concentrations can be used. The temperature of the copper sulfate solution was maintained at about 25° C., and the electrodeposited copper foil was electroplated for 10 seconds at a current density of 10 $A/dm^2$. After treatment, the treated copper foil was dried and wound into a roll.

To prevent exfoliation of the nodule layer, a copper covering was deposited onto the nodules. In this covering process, a copper sulfate solution was used in which the concentrations of copper sulfate and sulfuric acid were 320 g/L and 100 g/L, respectively. The temperature of electrolyte solution was maintained at about 40° C. and the current density was set at 15 A/dm' for 10 seconds.

After completing the cover plating process, two barrier layers were applied. First, nickel was deposited on the surface of nodule layer. The electrolysis conditions were as follows nickel sulfate 188 g/L, boric acid 32 g/L, hypophosphorous acid 4 g/L, temperature 20° C., pH 3.5. The current density was set at 0.7 A/dm' for 3 seconds. Secondly, a zinc layer was deposited upon nickel layer and the deposited side of the electrodeposited copper foil simultaneously. The electrolysis conditions were as follows: zinc sulfate of 11 g/L, ammonium vanadate of 0.25 g/L, pH 13, and a temperature of 15° C. The current density was set at 0.5 $A/dm^2$ for 2 seconds.

After formation of the barrier layers, washing is conducted with water and a chromium anti-tarnish layer was formed on the zinc layer by electroplating in a plating bath. The plating bath containing 5 g/L of chromic acid was maintained at pH 12.5 and a temperature of 35° C. The plating is conducted with a current density of 10 A/dm' for 5 seconds to form the chromium layer.

Finally, a coupling layer was formed on the chromium layer at the drum side. A silane solution is sprayed on the chromium layer for 10 seconds. The silane solution was a water solution containing 0.25 wt % of 3-Aminopropyltriethoxysilane.

After silane treatment the foil is heated at 120° C. for a one minute residence time in an oven and then wound into a roll.

Copper Foil Characterization

Copper foils made as described above and with specific conditions are indicated in Table 1. Eleven experiments with various conditions and eight comparative examples are listed the table exemplifying some embodiments of the surface treated copper foil.

TABLE 1

Conditions and Copper Foil Properties

| Experiment | polish condition buff # | buff speed m/min | Nodule Layer Formation NaWO$_4$ ppm | FeSO$_4$ ppm | Saccharin ppm | Wa Treated side μm | reflectance at 700 nm % | Rz[1] μm | Rz*[2] μm | Void volume on treated side Vvc μm$^3$/μm$^2$ | Vvv μm$^3$/μm$^2$ | Vv μm$^3$/μm$^2$ | peel strength lb/in | 8 GHz trans. Loss[3] |
|---|---|---|---|---|---|---|---|---|---|---|---|---|---|---|
| ex. 1 | 1500 | 350 | 250 | 2000 | 10 | 0.25 | 61.98 | 1.48 | 1.89 | 1.15 | 0.04 | 1.19 | 3.16 | ⊚ |
| ex. 2 | 1000 | 350 | 250 | 2000 | 10 | 0.35 | 53.21 | 1.32 | 1.67 | 1.18 | 0.05 | 1.23 | 3.44 | O |
| ex. 3 | 1000 | 250 | 150 | 2000 | 10 | 0.4 | 40.8 | 1.82 | 2.47 | 2.05 | 0.09 | 2.14 | 3.99 | O |
| ex. 4 | 2000 | 350 | 250 | 2000 | 10 | 0.12 | 63.49 | 1.61 | 2.13 | 1.11 | 0.04 | 1.15 | 2.7 | ⊚ |
| ex. 5 | 2000 | 450 | 350 | 2500 | 10 | 0.13 | 69.81 | 1.75 | 1.36 | 0.39 | 0.03 | 0.42 | 2.37 | ⊚ |
| ex. 6 | 1500 | 250 | 250 | 2000 | 10 | 0.33 | 51.24 | 1.51 | 2.05 | 1.17 | 0.06 | 1.23 | 3.24 | O |
| ex. 7 | 1500 | 350 | 150 | 2000 | 10 | 0.28 | 41.42 | 1.67 | 2.35 | 1.8 | 0.1 | 1.9 | 3.95 | ⊚ |
| ex. 8 | 1500 | 350 | 250 | 1500 | 10 | 0.3 | 45.1 | 1.63 | 2.21 | 1.73 | 0.08 | 1.81 | 3.79 | O |
| ex. 9 | 1500 | 450 | 250 | 2000 | 10 | 0.18 | 58.07 | 1.83 | 2.09 | 1.08 | 0.06 | 1.14 | 2.71 | ⊚ |
| ex. 10 | 1500 | 350 | 350 | 2000 | 10 | 0.25 | 64.78 | 1.24 | 1.85 | 0.66 | 0.01 | 0.67 | 2.52 | ⊚ |
| ex. 11 | 1500 | 350 | 250 | 2500 | 10 | 0.26 | 63.63 | 1.44 | 1.83 | 0.79 | 0.03 | 0.82 | 2.5 | ⊚ |
| comp. ex. 1 | 500 | 350 | 250 | 2000 | 10 | 0.74 | 31.29 | 1.98 | 2.48 | 1.32 | 0.05 | 1.37 | 3.64 | X |
| comp. ex. 2 | 1500 | 150 | 250 | 2000 | 10 | 0.71 | 31.69 | 1.64 | 2.41 | 1.21 | 0.06 | 1.27 | 3.42 | X |
| comp. ex. 3 | 1500 | 350 | 50 | 2000 | 10 | 0.41 | 29.35 | 1.65 | 3.66 | 2.36 | 0.13 | 2.49 | 4.17 | X |
| comp. ex. 4 | 1500 | 350 | 250 | 1000 | 10 | 0.38 | 28.84 | 1.54 | 3.59 | 2.44 | 0.15 | 2.59 | 3.91 | X |
| comp. ex. 5 | 2500 | 350 | 250 | 2000 | 10 | 0.55 | 33.96 | 1.89 | 2.62 | 1.13 | 0.05 | 1.18 | 3.12 | X |
| comp. ex. 6 | 1500 | 550 | 250 | 2000 | 10 | 0.67 | 32.88 | 1.74 | 2.39 | 1.11 | 0.06 | 1.17 | 3.4 | X |
| comp. ex. 7 | 1500 | 350 | 450 | 2000 | 10 | 0.38 | 74.87 | 1.32 | 1.58 | 0.18 | 0.01 | 0.19 | 1.14 | O |
| comp. ex. 8 | 1500 | 350 | 250 | 3000 | 10 | 0.35 | 75.2 | 1.48 | 1.76 | 0.23 | 0.01 | 0.24 | 1.55 | O |

[1]Rz: detected by contact method.
[2]Rz*: detected by non-contact method.
[3]⊚ indicates the transmission loss is from 0 dB/in to −0.75 dB/in;
O indicates the transmission loss is from −0.75 dB/in to −0.8 dB/in;
X indicates the transmission loss is lower than −0.8 dB/in.

Test Methods

Arithmetic Mean Waviness (Wa)

Arithmetic mean waviness (Wa) is defined according to JIS B 0601-2013 4.2.1. Measurements were made using a roughness measuring instrument (Kosaka Laboratory Ltd; SE 600 Series). The diameter of the tip of stylus is 2 μm, and the cone angle of the tip is 90°.

Wa was measured on the surface-treated side. The evaluation length was 7.5 mm, and the contour curve is filtered off fh(λc)=0.8 mm, fl(λf)=2.5 mm.

Roughness ($R_z$)

Rz is defined according to JIS B 0601-1994.

I. Contact method.

The same surface roughness measuring instrument and stylus as used for Wa measurements was used to detect the profile of the surface-treated side. The evaluation length was 4.0 mm, and the contour curve was filtered off fh(kc)=0.8 mm.

II. Non-Contact Method.

A surface texture analysis of laser microscope (manufactured by Olympus, LEXT OLS5000-SAF) was used to detect the profile of the surface-treated side. The test conditions are as follows.

Light source: 405 nm-wavelength
Objective lenses: 100× (MPLAPON-100×LEXT)
Optical zoom: 1.0×
Evaluation length: 4.0 mm
Resolution: 1024 pixels×1024 pixels
Conditions: Auto tilt removal
Filter: unfiltered Reflectance Reflectance was measures using a Konica minolta portable spectrophotometer CM-2500c. The reflectance of the treated side of the surface-treated copper foil was measured using 700 nm light. The illuminant is D65 and the display was SPECT GRAPH.

Volume Parameters

The void volume (Vv) values at a material ratio of 10% in Table 1 were obtained for the examples and comparative examples by a procedure in accordance with ISO 25178-2 (2012). Surface texture analysis was performed of images of a laser microscope. The laser microscope was a LEXT OLS5000-SAF manufactured by Olympus and the images were made at an air temperature of 24±3° C. and a relative humidity of 63±3%. The filter setting was set to unfiltered. The light source was a 405 nm-wavelength source. The objective lenses were 100× magnification (MPLAPON-100×LEXT). The optical zoom was set to 1.0×. The image area was set to 129 μm×129 μm. The resolution was set to 1024 pixels×1024 pixels. The condition was set to auto tilt removal.

The values for the core void volume (Vvc), as listed in Table 1 are calculated with the material ratios from 10% to 80%. The values for the dale void volume (Vvv), as listed in Table 1, are calculated with a material ratio at 80%. The units of void volume are μm$^3$/μm$^2$. The void volume (Vv) at mr=10 is the summation of these core void volume (Vvc) and the dale void volume (Vvv).

Peel Strength

Six pieces of commercial resin sheet (having thickness of 0.076 mm, S7439G from SyTech Corporation) were stacked together and a copper foil was placed on them. The copper foil and resin sheet were placed between two flat plates (Stainless Steel plates). The stack was hot pressed at a temperature of 200° C. and under a pressure of 400 psi for 120 minutes to form a laminate of copper foil and resin layer.

The peel strength was measured based on JIS C 6471 by peeling off the resin layer from the copper foil in the perpendicular direction (90° peel off direction).

Transmission Loss

The transmission characteristics were evaluated using a strip-line resonator technique. A copper foil was attached on a resin and further made into a strip-line, and this strip-line was used as source electrode. The thickness of the resin (S7439G from SyTech Corporation) was 152.4 µm, and had Dk=3.74 and Df=0.006 under 10 GHz signal test by IPC-TM 650 No. 2.5.5.5. The strip-line had a length=100 mm, width=120 µm, and thickness=35 µm.

After the strip-line was made, two surfaces were covered with two other resins (S7439G from SyTech Corporation), respectively, and two other copper foils were disposed on the resins as ground electrode. This assembly was without coverlay film and has a characteristic impedance of about 50Ω. Comparison of the signals transferred by the strip-line and the ground electrode provides the transmission Loss.

The measurement of the strip line and ground electrode was done using an Agilent PNA N5230C network analyzer. The frequency range used was 200 MHz to 15 GHz, the sweep number was 6401 point, the calibration was TRL and the test method was the Cisco S method.

As used herein the term "comprising" or "comprises" is used in reference to compositions, methods, and respective component(s) thereof, that are essential to the claimed invention, yet open to the inclusion of unspecified elements, whether essential or not.

As used in this specification and the appended claims, the singular forms "a," "an," and "the" include plural references unless the context clearly dictates otherwise. Thus for example, references to "the method" includes one or more methods, and/or steps of the type described herein and/or which will become apparent to those persons skilled in the art upon reading this disclosure and so forth. Similarly, the word "or" is intended to include "and" unless the context clearly indicates otherwise.

Other than in the operating examples, or where otherwise indicated, all numbers expressing quantities of ingredients or reaction conditions used herein should be understood as modified in all instances by the term "about". The term "about" when may mean±5% (e.g., ±4%, ±3%, ±2%, ±1%) of the value being referred to.

Where a range of values is provided, each numerical value between and including the upper and lower limits of the range is contemplated as disclosed herein. It should be understood that any numerical range recited herein is intended to include all sub-ranges subsumed therein. For example, a range of "1 to 10" is intended to include all sub-ranges between and including the recited minimum value of 1 and the recited maximum value of 10; that is, having a minimum value equal to or greater than 1 and a maximum value of equal to or less than 10. Because the disclosed numerical ranges are continuous, they include every value between the minimum and maximum values. Unless expressly indicated otherwise, the various numerical ranges specified in this application are approximations.

Unless otherwise defined herein, scientific and technical terms used in connection with the present application shall have the meanings that are commonly understood by those of ordinary skill in the art. Further, unless otherwise required by context, singular terms shall include pluralities and plural terms shall include the singular.

It should be understood that this invention is not limited to the particular methodology, protocols, and reagents, etc., described herein and as such may vary. The terminology used herein is for the purpose of describing particular embodiments only, and is not intended to limit the scope of the present invention, which is defined solely by the claims.

Any patents, patent applications, and publications including ASTM, JIS methods identified that are disclosed herein are expressly incorporated herein by reference for the purpose of describing and disclosing, for example, the methodologies described in such publications that can be used in connection with the present invention. These publications are provided solely for their disclosure prior to the filing date of the present application. Nothing in this regard should be construed as an admission that the inventors are not entitled to antedate such disclosure by virtue of prior invention or for any other reason. All statements as to the date or representation as to the contents of these documents is based on the information available to the applicants and does not constitute any admission as to the correctness of the dates or contents of these documents.

We claim:

1. A surface-treated copper foil comprising:
an electrodeposited copper foil including a drum side and a deposited side, and
a treatment layer disposed on the drum side providing a surface-treated side,
wherein the treatment layer comprises a nodule layer and wherein the surface-treated side exhibits a void volume (Vv) in a range of 0.4 to 2.2 $\mu m^3/\mu m^2$ and an arithmetic mean waviness (Wa) lower than or equal to 0.4 µm.

2. The surface-treated copper foil of claim 1, wherein the surface-treated side exhibits an arithmetic mean waviness (Wa) in a range of 0.1 to 0.4 µm.

3. The surface-treated copper foil of claim 1, wherein the surface-treated side exhibits a core void volume (Vvc) in a range of 0.4 to 2 $\mu m^3/\mu m^2$.

4. The surface-treated copper foil of claim 1, wherein the surface-treated side exhibits a dale void volume (Vvv) in a range of 0.01 to 0.1 $\mu m^3/\mu m^2$.

5. The surface-treated copper foil of claim 1, wherein the surface-treated side exhibits a reflectance at 700 nm in a range of 28% to 76%.

6. The surface-treated copper foil of claim 1, wherein the surface-treated side exhibits a reflectance at 700 nm greater than 40%.

7. The surface-treated copper foil of claim 6, wherein the surface-treated side exhibits a reflectance at 700 nm in a range of 40% to 70%.

8. The surface-treated copper foil of claim 1, wherein the treatment layer further comprises at least one of a barrier layer, an anti-tarnish layer, and a coupling layer.

9. The surface-treated copper foil of claim 8, wherein the barrier layer is made of metal or an alloy containing the metal, and the metal is selected from at least one of Ni, Zn, Cr, Co, Mo, Fe, Sn, and V.

10. The surface-treated copper foil of claim 8, wherein the coupling layer includes silicon.

11. The surface-treated copper foil of claim 1, wherein the nodule layer comprises copper nodules.

12. A device comprising,
a circuit board including the surface-treated copper foil of claim 1 and a plurality of components mounted on the circuit board,
wherein at least a first component and a second component of the plurality of components are electrically connected to each other through the surface-treated copper foil of the circuit board.

13. A laminate comprising,
a resin layer, and
a surface-treated copper foil comprising,
an electrodeposited copper foil including a drum side and a deposited side, a treatment layer disposed on the drum side providing a surface-treated side in contact with the resin layer, and wherein the treatment layer comprises a nodule layer, wherein the surface-treated side exhibits a void volume (Vv) in a range of 0.4 to 2.2 $\mu m^3/\mu m^2$, an arithmetic mean waviness (Wa) in a range of 0.1 to 0.4 µm, a core void volume (Vvc) in a range of 0.4 to 2 $\mu m^3/\mu m^2$, and a dale void volume (Vvv) in a range of 0.01 to 0.1 $\mu m^3/\mu m^2$, and a surface reflectance at 700 nm in a range of 40% to 70%.

14. A surface-treated copper foil comprising:

an electrodeposited copper foil including a drum side and a deposited side, and a treatment layer disposed on the drum side providing a surface-treated side, wherein the treatment layer comprises a nodule layer and wherein the surface-treated side exhibits a void volume (Vv) in a range of 0.4 to 2.2 $\mu m^3/\mu m^2$ and an arithmetic mean waviness (Wa) lower than or equal to 0.4 µm, wherein the nodule layer comprises copper nodules, and the treatment layer further comprises at least one of a barrier layer, an anti-tarnish layer, and a coupling layer.

\* \* \* \* \*